(12) United States Patent
Kishi et al.

(10) Patent No.: US 9,755,098 B2
(45) Date of Patent: Sep. 5, 2017

(54) RADIATION DETECTOR MANUFACTURED BY DICING A SEMICONDUCTOR WAFER AND DICING METHOD THEREFOR

(71) Applicant: Siemens Aktiengesellschaft, München (DE)

(72) Inventors: Noriyuki Kishi, Okinawa (JP); Tatsuhiro Koizumi, Okinawa (JP); Hiroyuki Shiraki, Okinawa (JP); Mitsuru Tamashiro, Okinawa (JP); Masaya Yamamoto, Okinawa (JP)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/893,539

(22) PCT Filed: Jun. 6, 2014

(86) PCT No.: PCT/EP2014/061891
§ 371 (c)(1),
(2) Date: Nov. 24, 2015

(87) PCT Pub. No.: WO2014/195488
PCT Pub. Date: Dec. 11, 2014

(65) Prior Publication Data
US 2016/0133776 A1    May 12, 2016

(30) Foreign Application Priority Data
Jun. 7, 2013  (JP) ................................ 2013-120969

(51) Int. Cl.
*H01L 21/78* (2006.01)
*H01L 27/146* (2006.01)
(Continued)

(52) U.S. Cl.
CPC ............ *H01L 31/115* (2013.01); *C30B 29/48* (2013.01); *C30B 33/06* (2013.01); *H01L 21/463* (2013.01);
(Continued)

(58) Field of Classification Search
CPC . H01L 31/115; H01L 31/1032; H01L 31/125; H01L 31/141; H01L 31/145;
(Continued)

(56) References Cited

U.S. PATENT DOCUMENTS 4,243,885 A * 1/1981 Agouridis ............... G01T 1/026
136/259
5,182,233 A * 1/1993 Inoue .................... H01L 21/304
148/DIG. 28
(Continued)

FOREIGN PATENT DOCUMENTS

EP    0341034 A2   11/2008
JP    62105446 A    5/1987
(Continued)

OTHER PUBLICATIONS

Kamimura et al. Experimental evaluation of the Peierls stresses in a variety of crystals and their relation to the crystlal structure. SciVerse ScienceDirect, Acta Materialia 61 (2013) 294-309.*
(Continued)

*Primary Examiner* — Galina Yushina
(74) *Attorney, Agent, or Firm* — Harness, Dickey & Pierce, PLC

(57) ABSTRACT

An embodiment relates to a group II-VI semiconductor wafer of a radiation detector, and an embodiment relates to a method for producing same. An embodiment of the present invention provides a group II-VI semiconductor of a radiation detector enabling reduction or restriction of the edge effect (or the end surface effect) and a method for producing
(Continued)

same. An embodiment of the present invention provides a radiation detector obtained by half-cutting or full-cutting a group II-VI semiconductor wafer having a zinc blende structure in which the wafer has a {001} plane main surface, and cut planes according to the half-cutting or full-cutting have an angle θ (≠0°) relative to the slip direction of the wafer.

6 Claims, 5 Drawing Sheets

(51) Int. Cl.
    *H01L 31/115*     (2006.01)
    *H01L 21/463*     (2006.01)
    *C30B 29/48*     (2006.01)
    *C30B 33/06*     (2006.01)

(52) U.S. Cl.
    CPC ........ *H01L 21/78* (2013.01); *H01L 27/14658* (2013.01); *H01L 27/14696* (2013.01)

(58) Field of Classification Search
    CPC . H01L 21/462; H01L 21/78; H01L 27/14658; H01L 27/14696; H01L 27/14667; C30B 33/06
    See application file for complete search history.

(56) References Cited

U.S. PATENT DOCUMENTS

| | | |
|---|---|---|
| 6,034,373 A | 3/2000 | Shahar |
| 6,928,144 B2 | 8/2005 | Li |
| 2004/0129994 A1* | 7/2004 | Moriyama ...... H01L 31/022408 |
| | | 257/471 |
| 2011/0272589 A1 | 11/2011 | Yang |
| 2013/0042735 A1* | 2/2013 | Lim ......................... B26D 1/15 |
| | | 83/56 |

FOREIGN PATENT DOCUMENTS

| | | |
|---|---|---|
| JP | 1225510 H | 9/1989 |
| JP | H02192753 A | 7/1990 |
| JP | 0365599 A | 3/1991 |
| JP | 2002214351 A | 7/2002 |
| JP | 2002344000 A | 11/2002 |
| JP | 2003257892 A | 9/2003 |

OTHER PUBLICATIONS

International Search Report PCT/ISA/210 for International Application No. PCT/EP2014/061891 dated Sep. 15, 2014.
Written Opinion of the International Searching Authority PCT/ISA/237 for International Application No. PCT/EP2014/061891 dated Sep. 15, 2014.
Nakazawa Kazuhiro et.al: "Improvement of the CdTe Diode Detectors using a Guard-ring Electrode", in: IEEE, 2004; 2004.
Shor Asher et.al.: "Edge Effects in Pixelated CdZnTe Gamma Detectors", in: IEEE Transactions on Nuclear Science, vol. 51, No. 5, pp. 2412-2418, Oct. 2004; 2004.
Bosma Marten et.al.: "The Influence of Edge Effects on the Detection Properties of Cadmium Telluride" in: IEEE Nuclear Science Symposium Conference Record, vol. 18, No. 3, pp. 4812-4817, 2011; 2011.
Japanese Office Action dated Jan. 24, 2017 issued in corresponding Japanese Application No. 2013-120969 (with translation).

\* cited by examiner

RADIATION DETECTOR MANUFACTURED BY DICING A SEMICONDUCTOR WAFER AND DICING METHOD THEREFOR

PRIORITY STATEMENT

This application is the national phase under 35 U.S.C. §371 of PCT International Application No. PCT/EP2014/061891 which has an International filing date of Jun. 6, 2014, which designated the United States of America and which claims priority to Japanese patent application number JP 2013-120969 filed Jun. 7, 2013, the entire contents of which are hereby incorporated herein by reference.

FIELD

The technology described herein generally relates to a radiation detector employing a semiconductor, and further generally relates to an X-ray imaging device employing said radiation detector.

BACKGROUND

An X-ray detector based on a group II-VI semiconductor such as CdTe or $Cd_xZn_{1-x}Te$ (0≤x≤1) is used in various fields including nuclear physics, X-ray and gamma ray astronomy, and medical applications. An important feature of such a detector is a uniform signal response over the whole detection region. However, the signal response sensitivity of a radiation detector obtained by dicing a wafer gradually increases or decreases close to the edges of the detector, and a reduction in performance is demonstrated close to the edges of the detector. This is known as the "edge effect or end face effect (edge effect)", and is also reported in US Patent Laid-Open US 2011/0272589 A1 and A. Shor at al., "EDGE EFFECTS IN PIXELATED CdZnTe GAMMA DETECTORS", IEEE TNS Vol. 51, No. 5, 2004 and M. Bosma et al., "THE INFLUENCE OF EDGE EFFECTS ON THE DETECTION PROPERTIES OF CdTe", IEEE conference record 2011, for example.

The edge effect (or end face effect) may be attributed to distortion of the internal electrical field close to the edges or to very high surface leakage current, caused by defects produced as a result of unsuitable dicing or surface instability etc. This leads to a reduction in detection performance close to the edges, referred to as low charge collection efficiency or low energy tail structure in the photoelectric peak of the energy spectrum.

One method which is currently used to solve the edge effect (or end face effect) employs a guard ring. The guard ring is, according to a normal example, formed at the main surface peripheral edge region of a detector and is electrically connected, or floating or biased. By means of the guard ring, distortion of the internal electrical field close to the edges of the detector is reduced and the guard ring collects current so that side-surface leakage current is restricted. It is therefore possible to envisage an improvement in detector performance close to the edges. Until the present time, various kinds of guard ring structures in which a guard ring is formed on the main surface or side surface of a detector have been used in radiation detectors (US Patent Laid-Open US 2011/0272589 A1, U.S. Pat. Nos. 6,034,373 and 6,928,144; Nakazawa et al., "IMPROVEMENT OF THE CdTe DIODE DETECTORS USING A GUARD RING ELECTRODE", IEEE 2004).

However, it may still not be possible to adequately restrict the edge effect (or end face effect) using a guard ring. This is believed to be due to unforeseeable defects on the side surface of the detector caused by unsuitable dicing or inadequate surface stability. In addition to using a guard ring, it is therefore important to reduce or restrict defects at the side surface of the detector. In order to eliminate such defects, side surface polishing or etching may be used for individual detectors, but it is difficult to control such processes and they are unsuitable for mass production in semiconductor wafer processes.

Unsuitable dicing produces mechanical defects at the side surface of the detector such as a large kerf width, and cracking or chipping which produces a rough side surface, and also results in a reduction in detector performance and a decrease in yield. A method of dicing a GaAs wafer that can restrict such mechanical defects is described in U.S. Pat. No. 5,182,233. U.S. Pat. No. 5,182,233 indicates that there is a clear difference in comparison with the mechanical cutting quality at the side surface of a semiconductor detector when a GaAs wafer is diced at the <110> and <001> crystal orientations. When a GaAs wafer is diced at the <110> crystal orientation, a large kerf width and chipping occur, and cracking and roughness are produced at the side surface of the detector. In contrast to this, when a GaAs wafer is diced at the <001> crystal orientation, the kerf width is reduced and chipping is restricted.

In the case of a group II-VI semiconductor wafer such as CdTe, no clear difference is apparent in the mechanical cutting quality at the side surface of a detector diced at the <110> crystal orientation and the side surface of a detector diced at the <001> crystal orientation, as mentioned above. There is thus a need for a dicing method which takes account of both reducing mechanical defects such as those mentioned above and reducing internal progressive defects which occur close to the edges of the detector and progress (spread) to the inside of the detector. The present invention relates to a group II-VI semiconductor radiation detector based on CdTe or CdZnTe, for example, and to a method for producing same; the present invention provides a radiation detector enabling a reduction or restriction of the edge effect (or the end surface effect) and a dicing method therefor, while taking account of the correlation between progression of defects and the slip system of a CdTe crystal, to give one example.

SUMMARY

One embodiment of the present invention relates to a radiation detector obtained by half-cutting or full-cutting a group II-VI semiconductor wafer having a zinc blende structure in which the wafer has a {001} plane main surface, characterized in that cut planes according to the half-cutting or full-cutting have an angle θ (≠0°) relative to the slip direction of the wafer; the present invention further relates to an X-ray imaging device employing said radiation detector.

An embodiment of the present invention relates to a method for dicing a group II-VI semiconductor wafer having a zinc blende structure in which the wafer has a {001} plane main surface, characterized in that the wafer is subjected to half-cutting or full-cutting at an angle θ (≠0°) relative to the slip direction of the wafer.

DETAILED DESCRIPTION OF THE EXAMPLE EMBODIMENTS

One embodiment of the present invention relates to a radiation detector obtained by half-cutting or full-cutting a group II-VI semiconductor wafer having a zinc blende structure in which the wafer has a {001} plane main surface, characterized in that cut planes according to the half-cutting or full-cutting have an angle θ (≠0°) relative to the slip direction of the wafer; the present invention further relates to an X-ray imaging device employing said radiation detector.

It should be noted that in this instance, a wafer which has a {001} plane main surface includes not only a {001} plane wafer, but also a wafer offset by ±10° with respect to the {001} plane. The same applies hereinafter.

A CdTe-based compound semiconductor wafer is more suitable as the group II-VI semiconductor wafer. In addition, the angle θ is preferably in the range of 30° to 60°, and 45° is especially preferred.

An embodiment of the present invention relates to a method for dicing a group II-VI semiconductor wafer having a zinc blende structure in which the wafer has a {001} plane main surface, characterized in that the wafer is subjected to half-cutting or full-cutting at an angle θ (≠0°) relative to the slip direction of the wafer.

In this instance also, a CdTe-based compound semiconductor wafer is more suitable as the group II-VI semiconductor wafer, and the angle θ is preferably in the range of 30° to 60°, and 45° is especially preferred.

The first mode of embodiment of the present invention provides a dicing method in which a CdTe wafer with a {001} plane orientation, for example, which serves as a group II-VI semiconductor wafer, is diced in the [010] and/or [−100] direction, in order to provide a radiation detector which reduces or restricts the edge effects (or end face effect). A detailed description of this will be given below in comparison with a dicing method formed in accordance with technology in current use.

The crystal plane and crystal orientation referred to in the present specification, drawings and claims are expressed as Miller's indices. A plane is represented by "( )" and a group of equal planes is represented by "{ }". Orientation is represented by "[ ]" and a group of equal orientations is represented by "<>". Furthermore, a negative number in an orientation expressed with a line above is represented by "−" (minus).

Figure 1:
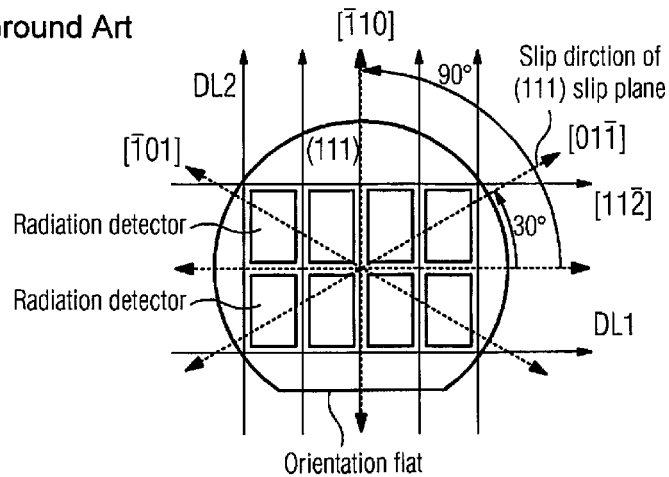
FIG. 1 illustrates a prior art dicing method.

FIG. 1 relates to a method for dicing a CdTe wafer 1 and shows a conventional example, which is used at the present time. This wafer has a {111} plane main surface, and has an orientation flat 1 of the {110} plane, which is formed by cleavage of the wafer 1 along the cleavage plane in order to identify the cleavage plane of the wafer 1 in the production process. Single crystals having a zinc blende structure such as CdTe tend to simply split along the {110} cleavage plane and a large number of radiation detector patterns and dicing line patterns (DL1 and DL2 in the figure) are formed on the main surface parallel to one of the {110} cleavage planes.

The wafer 1 is diced along the [11−2] direction dicing line DL1 and along the [−110] direction dicing line DL2 orthogonal to the dicing line DL1 (the solid line arrows in the figure). In the dicing process, defects in terms of stress, damage, slip and dislocation, for example, are produced close to the edges of the detector 2 and may further advance from the edges into the detector 2 (chip). In particular, such defects tend to progress along the {111} slip plane in the <110> direction, such as the ±[−101], ±[−110], ±[01−1] etc. directions which intersect each other at 60° (the dotted lines in the figure).

Figure 2:
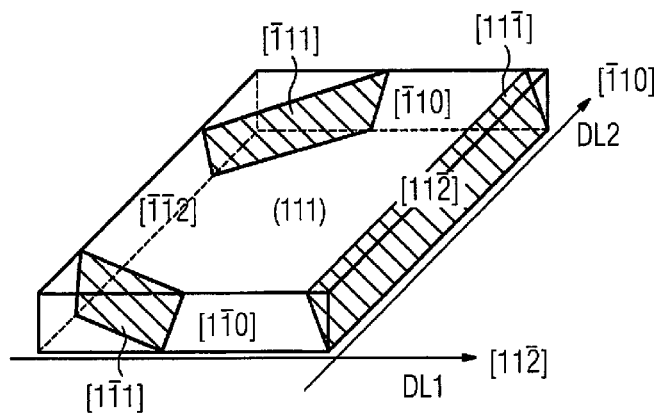
FIG. 2 shows a prior art detector obtained by the method in FIG. 1.

FIG. 2 is a schematic transparent diagram of a detector 2 obtained by the method for dicing this kind of {111} CdTe wafer. Said detector has three {111} slip planes, namely (1−11), (11−1) and (−111) (shown as shaded regions in the Figure). These planes can slip to a <110> slip direction of ±[−101], ±[−110], ±[01−1]. When the wafer is diced along the [11−2] direction dicing line DL1, the angle formed by the [11−2] dicing direction and the [01−1] and [−101] slip directions is 30°, while the angle formed with the [−110] slip direction is 90°. This means that defects caused by dicing can also progress into the detector 2 at orientations of 30° and 90°. On the other hand, when the wafer is diced along the [−110] direction dicing line DL2, the angle formed by the [−110] dicing direction and the [−110] slip direction is 0°, while the angle formed with the [−101] and [01−1] slip directions is 60°. This means that defects can also progress into the detector 2 at orientations of 0° and 60°.

It is speculated that defects tend to progress in the <110> slip direction in proximity to the dicing direction. In this case, the defects can readily progress into the detector 2 when the angle formed by the dicing direction and the slip direction is 0°, but when the angle formed by the dicing direction and the slip direction is 90°, progression into the detector 2 is relatively limited. Defects therefore progress more readily into the detector in the [−110] dicing direction than the [11−2] dicing direction, so the abovementioned edge effect (or end face effect) becomes apparent along the [−110] dicing direction rather than the [11−2] dicing direction.

Figure 3:
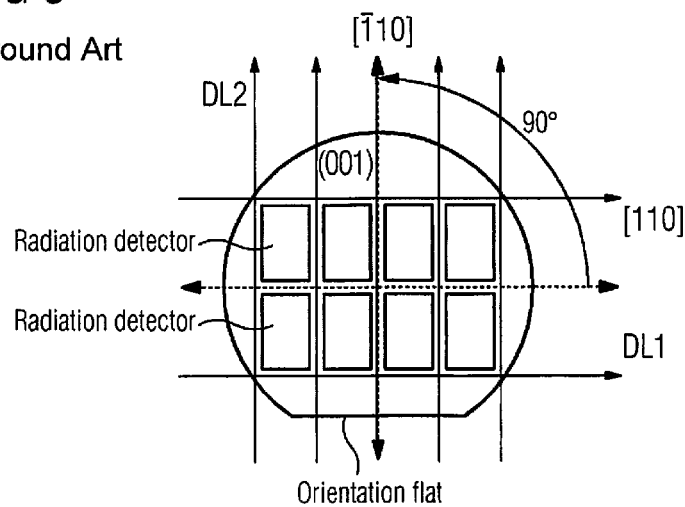
FIG. 3 illustrates a different example of a prior art dicing method.

FIG. 3 relates to a method for dicing a CdTe wafer and shows an example of different technology to that described above which is used at the present time. This wafer 1 has a {001} plane main surface, and has orientation flat 1a of the {110} plane. A large number of radiation detector patterns and dicing line patterns are formed on the main surface parallel to one of the {110} cleavage planes. The wafer 1 is diced along the [110] direction dicing line DL1 and along the [−110] direction dicing line DL2 orthogonal to the dicing line DL1. {111} plane slip directions such as the ±[110], ±[−110] etc. directions which intersect each other at 90° are shown by the dotted line arrows in the figure.

Figure 4:
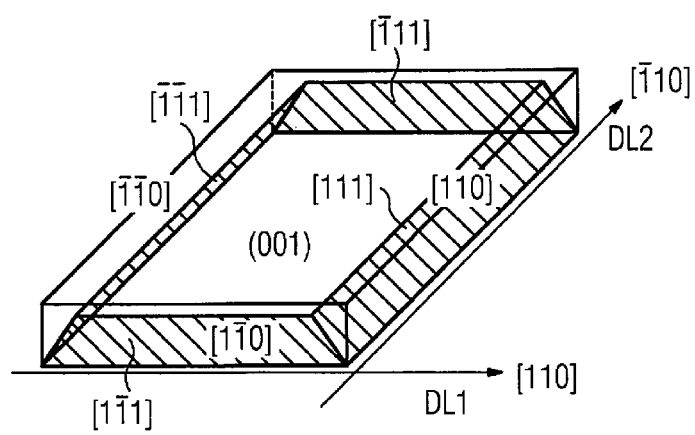
FIG. 4 shows a prior art detector obtained by the method in FIG. 3.

FIG. 4 is a schematic transparent diagram of a detector obtained by the method for dicing this kind of {001} CdTe wafer. Said detector 2 has four {111} slip planes, namely (−111), (1−11), (−1−11) and (111). These planes can slip to a <110> slip direction, such as ±[110] and ±[−110] shown in FIG. 3.

When the wafer is diced along the [110] direction dicing line DL1, the angle formed by the [110] dicing direction and the [110] slip direction is 0°, while the angle formed with the

[−110] slip direction is 90°. This means that defects can also progress into the detector 2 at orientations of 0° and 90°. Likewise, when the wafer is diced along the [−110] direction dicing line DL2, the angle formed by the [−110] dicing direction and the [−110] slip direction is 0°, while the angle formed with the [110] slip direction is 90°. This means that defects can also progress into the detector 2 at orientations of 0° and 90°.

It is speculated that defects tend to progress into the detector 2 when the angle formed by the dicing direction and the slip direction is 0°. In this case, defects may easily progress along all dicing directions and the edge effect (or end face effect) becomes apparent close to all four edges of the detector 2.

Figure 5:
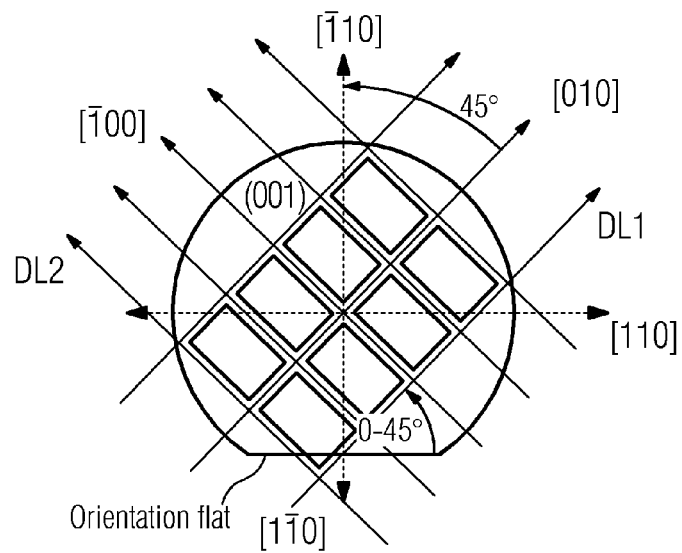
FIG. 5 illustrates a first mode of embodiment of the dicing method according to the present invention.

FIG. 5 shows a first mode of embodiment of the dicing method according to the present invention, which is performed on a CdTe wafer 1 as one example of a group II-VI semiconductor wafer. The wafer 1 in the first mode of embodiment has a {001} plane main surface and has orientation flat 1a of the {110̄56} plane.

Unlike the two associated technologies shown in FIGS. 1-4 described above, a large number of radiation detector patterns and dicing line patterns are formed in the main surface at an angle θ (≠0°) and 90°) with respect to the {110̄56} cleavage plane and with an intersecting dicing direction. The angle θ is preferably 45° and in this case the patterns are aligned parallel to one of the {10̄056} planes. This wafer 1 is diced along the [010] direction dicing line DL1 and along the [−100] direction dicing line DL2 orthogonal to the dicing line DL1. Slip directions of the {111} slip plane such as the ±[110], ±[−110] etc. directions which intersect each other at 90° are shown by the dotted line arrows in the figure. As is clear from FIG. 5, the dicing direction does not coincide with any slip direction.

Figure 6:
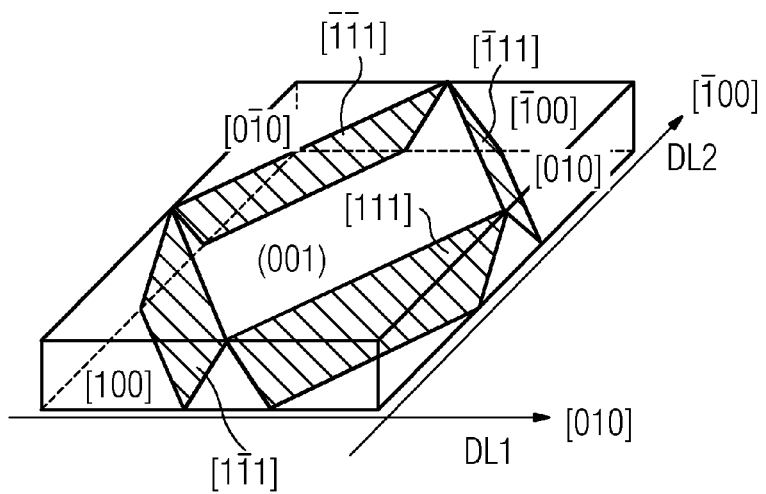
FIG. 6 shows a detector in accordance with the dicing method of the first mode of embodiment.

FIG. 6 is a schematic transparent diagram of a detector 10 obtained by the method according to the first mode of embodiment for dicing this kind of {001} CdTe wafer. The wafer according to the first mode of embodiment has four {111} slip planes, namely (−111), (1−11), (−1−11) and (111). These planes can slip to a <110> slip direction, such as ±[110] and ±[−110] shown in FIG. 5. When the wafer is diced along the [010] direction dicing line DL1, the angle formed by the [010] dicing direction and the [−110] and [110] slip directions is 45° (when θ=45°). When the wafer is diced along the [−110] direction dicing line DL2, the angle formed by the [−110] dicing direction and the [−110] and [110] slip direction is likewise 45° (when θ=45°). In other words, the dicing direction does not coincide with any slip direction.

According to the first mode of embodiment, it is possible to limit the progress of defects in all dicing directions. This makes it possible to restrict the edge effect (or end face effect) close to all four edges of the detector 10. The angle θ of the dicing direction with respect to the cleavage plane or orientation flat (≠0° and 90°) can also be set at an angle other than 45° provided that the same effect as above can be achieved.

The edge effect (or end face effect) close to the detector edges is sufficiently reduced and restricted, so there are advantages in that the uniformity of detection response can be improved over the whole detection region and the radiation detector yield can be increased. Furthermore, the dicing method described in the first mode of embodiment can easily be incorporated into existing processes.

The first mode of embodiment relates to a description concerning a CdTe crystal, but the group II-VI semiconductor which is applied may preferably be a CdTe-based compound semiconductor having a zinc blende structure such as $Cd_xZn_{1-x}Te$ (0≤x≤1) or $Cd_xMn_{1-x}Te$ (0≤x≤1), in particular. Furthermore, the dicing method in the first mode of embodiment is not limited to a wafer and it may be applied to any object to be diced that has a zinc blende structure. Alternatively, the dicing method may be applied to all kinds of detectors having an electrode structure, such as a planar or pixelated detector, and it may be applied to radiation detectors regardless of whether or not a guard ring is present. The dicing apparatus may employ a conventional dicing saw or it is equally feasible to use another type of cutting tool such as a wire saw or laser. It should be noted that the dicing is not limited to the process for cutting wafers into chips as described above (full-cut dicing) and the process of forming surface grooves (half-cut dicing) is also included, as will be described hereinafter.

The abovementioned matters are also the same in another mode of embodiment to be described below.

Figure 7:
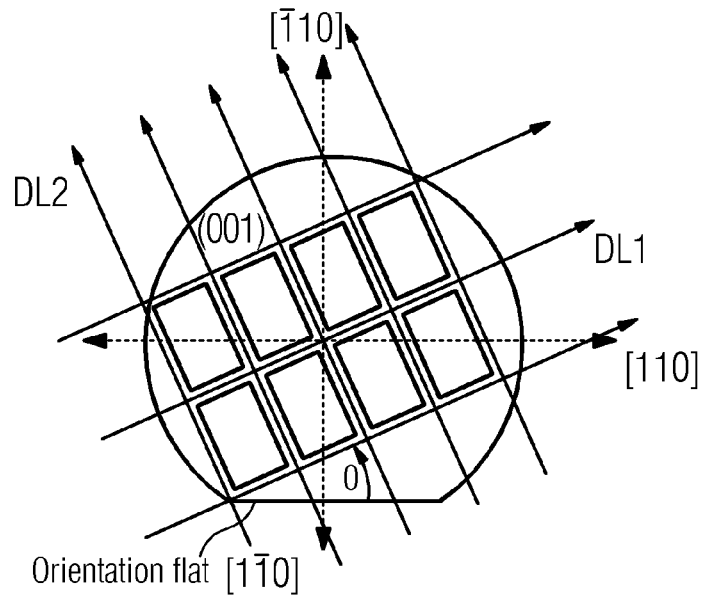
FIG. 7 shows a second mode of embodiment of the dicing method according to the present invention.

FIG. 7 shows a dicing method according to a second mode of embodiment; in the second mode of embodiment, the dicing direction is set at any angle θ ranging from 30° to 45° with respect to one {110̄56} cleavage plane. If the situation is considered from the point of view only of restricting inward progress of defects in accordance with the matters shown in FIG. 6, the angle θ should suitably be in the range of 30° to 60°. Optimally, it is believed that the angle θ should be 45° with respect to the cleavage plane (or orientation flat), as indicated in the first mode of embodiment.

Figure 8:
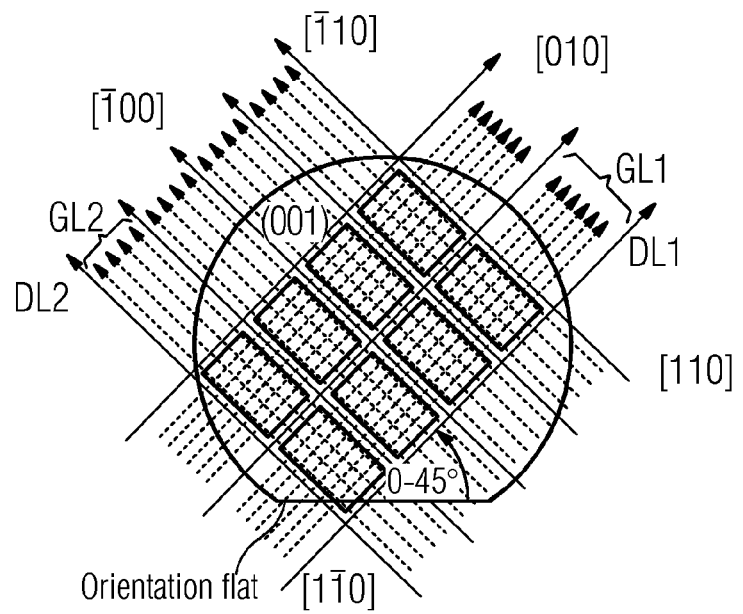
FIG. 8 shows a third mode of embodiment of the dicing method according to the present invention.
Figure 9:
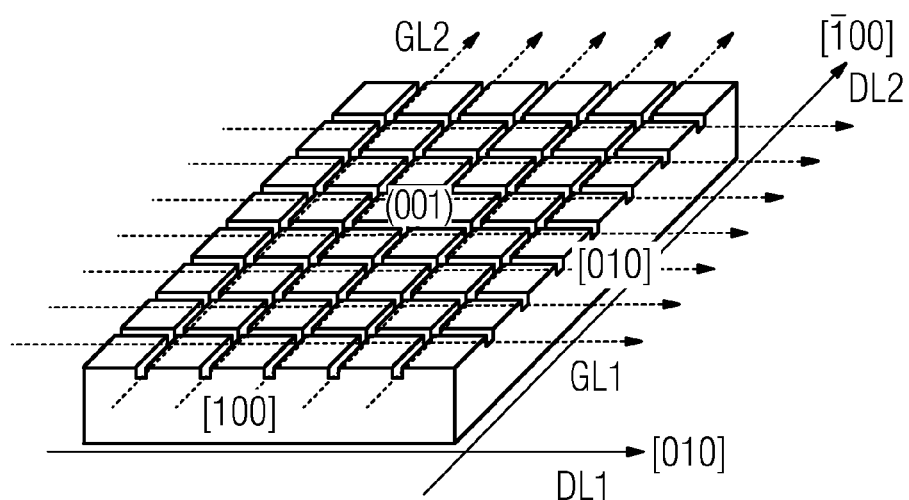
FIG. 9 shows a detector in accordance with the dicing method of the third mode of embodiment.

FIG. 8 shows a dicing method according to a third mode of embodiment. The abovementioned first and second modes of embodiment described the example of full-cut dicing in which a wafer 1 is completely cut from the main surface to the rear surface to form a large number of separate chips. On the other hand, the third mode of embodiment relates to an example of half-cut dicing in which incisions are made in the main surface (or rear surface) of a wafer 1 to a predetermined depth which is less than the thickness of the wafer 1 in order to form grooves. As shown in the oblique view of FIG. 9, a large number of grooves greater than one are formed in the main surface of the wafer 1 by means of this dicing method. The main surface of the detector 10 is segmented into a large number of small regions by the large number of grooves formed to a predetermined depth.

In the case of the third mode of embodiment also, the angle θ with respect to one of the cleavage planes {110̄56} (orientation flat) is set at 45°. In other words, the groove lines GL1 and GL2 indicating the half-cut dicing direction for forming the grooves are determined as the [010] direction and [−100] direction, as shown by the dotted line arrows in the Figure. In the same way, the dicing line DL1 expressing the full-cut dicing direction is determined as the [010] direction, while the full-cut dicing line DL2 orthogonal to the dicing line DL1 is determined as the [−100] direction (solid line arrows). A large number of grooves are formed in the main surface of the wafer 1 by dicing along the groove lines GL1, GL2, and wafers are cut by dicing along the dicing lines DL1, DL2. It should be noted that in FIG. 8, the slip direction relating to the {111} plane has been omitted.

A number of modes of embodiment have been described in relation to the present invention. However various modes of embodiment other than those described above are also feasible, so the invention should be interpreted on the basis of the claims.

The invention claimed is:

1. A group II-VI semiconductor wafer comprising:
    a zinc blende structure in which the wafer has a {001} plane main surface, and
    half-cut or full-cut planes, the cut planes having an angle θ of about 30° or about 60° relative to a slip direction of the wafer.

2. The group II-VI semiconductor wafer of claim 1 wherein the wafer is a CdTe-based compound semiconductor wafer.

3. The group II-VI semiconductor wafer of claim 1, wherein the wafer is for use in a radiation detector of an X-ray imaging device.

4. The group II-VI semiconductor wafer of claim 2, wherein the wafer is for use in a radiation detector of an X-ray imaging device.

5. A method for dicing a group II-VI semiconductor wafer having a zinc blende structure in which the wafer has a {001} plane main surface, comprising:
    subjecting the wafer to half-cutting or full-cutting at an angle θ a of about 30° or 60° relative to a slip direction of the wafer.

6. The dicing method of claim 5, wherein the group II-VI semiconductor wafer is a CdTe-based compound semiconductor wafer.

* * * * *